United States Patent
Sauer et al.

(10) Patent No.: US 10,756,704 B2
(45) Date of Patent: Aug. 25, 2020

(54) SAW FILTER HAVING SUPPRESSED SHEAR MODE

(71) Applicant: SNAPTRACK, INC., San Diego, CA (US)

(72) Inventors: Wolfgang Sauer, Mering (DE); Franz Kubat, München (DE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/763,008

(22) PCT Filed: Sep. 20, 2016

(86) PCT No.: PCT/EP2016/072284
§ 371 (c)(1),
(2) Date: Mar. 23, 2018

(87) PCT Pub. No.: WO2017/050750
PCT Pub. Date: Mar. 30, 2017

(65) Prior Publication Data
US 2019/0089335 A1    Mar. 21, 2019

(30) Foreign Application Priority Data
Sep. 25, 2015 (DE) .......... 10 2015 116 223

(51) Int. Cl.
*H03H 9/64* (2006.01)
*H03H 9/54* (2006.01)
(Continued)

(52) U.S. Cl.
CPC ...... *H03H 9/6489* (2013.01); *H03H 9/02559* (2013.01); *H03H 9/02834* (2013.01);
(Continued)

(58) Field of Classification Search
CPC .. H03H 9/6489; H03H 9/725; H03H 9/02937; H03H 9/02559; H03H 9/02866;
(Continued)

(56) References Cited

U.S. PATENT DOCUMENTS 6,127,769 A * 10/2000 Kadota .............. H03H 9/02669
310/313 B
6,150,900 A * 11/2000 Kadota .............. H03H 9/02669
310/313 B
(Continued)

FOREIGN PATENT DOCUMENTS

WO    WO-2014108254 A1    7/2014
WO    WO-2014139590 A1    9/2014

OTHER PUBLICATIONS

International Search Report and Written Opinion—PCT/EP2016/072284—ISA/EPO—dated Dec. 20, 2016.
(Continued)

*Primary Examiner* — Robert J Pascal
*Assistant Examiner* — Jorge L Salazar, Jr.
(74) *Attorney, Agent, or Firm* — Patterson + Sheridan, LLP

(57) ABSTRACT

The aim according to the invention is to suppress a disturbing SH mode in a ladder-type filter. This aim is achieved in that the resonance frequency of the series resonator responsible therefor is moved and, at the same time, the pole zero distance of the series resonator is reduced by parallel connection with a capacitor. The antiresonance of the series resonator and therefore also the passband thus remain unchanged.

15 Claims, 6 Drawing Sheets

(51) Int. Cl.
   *H03H 9/02* (2006.01)
   *H03H 9/72* (2006.01)
(52) U.S. Cl.
   CPC .... *H03H 9/02866* (2013.01); *H03H 9/02937* (2013.01); *H03H 9/542* (2013.01); *H03H 9/6483* (2013.01); *H03H 9/725* (2013.01)
(58) Field of Classification Search
   CPC ... H03H 9/02834; H03H 9/6483; H03H 9/542
   USPC .......................................... 333/133, 193–196
   See application file for complete search history.

(56) References Cited

U.S. PATENT DOCUMENTS

| | | | | |
|---|---|---|---|---|
| 2011/0316649 | A1* | 12/2011 | Link | H03H 9/566 |
| | | | | 333/133 |
| 2013/0285504 | A1 | 10/2013 | Tamasaki | |
| 2014/0167881 | A1 | 6/2014 | Iwasaki et al. | |

OTHER PUBLICATIONS

Plessky V., et al., "Interaction between the Rayleigh-type SAW and the SH-Wave in a Periodic Grating on a 128 DEG—LN Substrate", Ultrasonics Symposium (IUS), 2010, IEEE, Oct. 11, 2010 (Oct. 11, 2010), pp. 167-170, XP031953003, DOI: 10.1109/ULTSYM.2010.5935868, ISBN: 978-1-4577-0382-9.

* cited by examiner

SAW FILTER HAVING SUPPRESSED SHEAR MODE

CROSS-REFERENCE TO RELATED APPLICATIONS

This application is a national stage application under 35 U.S.C. 371 of PCT/EP2016/072284, filed Sep. 20, 2016, which claims the benefit of German Patent Application Serial No. 102012116223.7, filed on Sep. 25, 2015, both of which are incorporated herein by reference in their entirety.

DESCRIPTION

To reduce the temperature response of SAW filters, they are given a compensation layer normally consisting of SiO2. A side effect of this measure, however, is that the coupling is reduced. Broadband filters with such a compensation layer can therefore be realized only on high-coupling substrates.

Bandpass filters made of SAW resonators having a compensation layer can, for example, be made on lithium niobate crystals having a red-128 cutting angle. The resonance frequency of the acoustic Rayleigh mode is used on this substrate material.

In many filters with certain material combinations for electrodes and layers deposited thereon, and/or for certain layer thickness combinations, however, a parasitic SH mode (shear horizontal mode) is capable of propagation on lithium niobate. The resonance frequency of the SH mode is above the resonance frequency of the Rayleigh mode. For the series resonators of a filter, the SH resonances are in the range of the upper passband edge of the filter and cause drops in the transmission function. Even if the geometry of this filter is optimized for maximum suppression of the SH mode, it can nevertheless be excited to a greater extent as a result of geometric deviations caused by tolerances and under temperature and power loads. This can cause an increased temperature and power load on the resonators that could result in premature wear and, ultimately, failures of the filter.

BRIEF SUMMARY OF THE INVENTION

The object of the present invention is therefore to safely and permanently prevent a disturbing SH mode in the frequency range of the upper passband edge of a bandpass filter made up of SAW resonators.

This object is achieved by a SAW filter according to the disclosure. Further embodiments of the invention and a method for shifting a disturbing SH mode in a SAW filter are disclosed in further claims.

A SAW filter according to the invention is constructed from SAW resonators and has a ladder-type structure. This comprises a series branch connected between the filter input and output, in which series resonators are arranged. Branching off from the series branch, parallel branches are provided, which connect the series branch to a fixed potential and in particular to ground. A filter has, for example, between two and five parallel branches and just as many series resonators. However, the number of series resonators can also differ from the number of parallel resonators. Furthermore, a filter may have a higher number of resonators if a higher selection is desired.

In the filter, which so far is of a known construction, there is now according to the invention a first series resonator, which has the lowest anti-resonance frequency of all series resonators and which is provided with the largest finger period. The pole zero distance of this series resonator is reduced compared to the other series resonators. The reduction of the pole zero distance is dimensioned such that, due to the smaller finger period and the smaller pole zero distance, the parasitic shear mode (SH mode) of this first series resonator has disappeared from the passband of the filter or occurs only at a frequency above the passband edge.

A first capacitor designed as an interdigital structure can be connected in parallel to this first series resonator in order to reduce the pole zero distance. The value of this parallel-connected capacitor is dimensioned such that, due to the smaller finger period and the smaller pole zero distance, the parasitic shear mode (SH mode) of this first series resonator has disappeared from the passband of the filter or occurs only at a frequency above the passband edge.

In other words, in the case of the series resonator, which has the lowest resonance frequency and anti-resonance frequency by design, the pole zero distance is reduced by the parallel connection of a capacitor. Since the anti-resonance also shifts toward lower frequencies, which are less favorable for the passband, this is compensated by an opposite shift in frequency, which is achieved by reducing the finger period. Here, the compensation can take place in such a way that the anti-resonance frequency returns to its original position before the pole zero distance was reduced. In order to avoid increasing the total capacitance of the resonator with parallel-connected capacitor over the original value of the resonator, the resonator is correspondingly reduced by reducing the aperture or reducing the number of fingers.

As a result, a filter is obtained in which the interfering resonance to be assigned to the shear mode has completely disappeared from the passband and comes to rest above the passband edge. Here, the bandwidth and insertion loss of the filter remain virtually unchanged, so that despite deviation from a known and already optimized design as regards the filter properties and in particular the passband, a deterioration of the filter property in the passband does not need to be accepted.

Such a filter can be realized with simple means and without much effort. The additional capacitor also requires only an insignificantly higher area on the filter substrate, since at the same time the capacitance of the resonator is to be reduced in order to keep the total capacitance of the parallel circuit of capacitor and resonator within the required range.

The parallel-connected first capacitor can be formed as an interdigital structure with the same metallization as the resonators and will then require no additional manufacturing steps.

The parallel-connected first capacitor can, however, also in principle be designed in a different technology, for example, as a metal/insulator/metal stack, which is designed to be integrated on the filter, on the housing or filter package, or as a discrete component.

Instead of a parallel-connected capacitor, the pole zero distance of the resonator can also be created by omission weighting of electrode fingers of the series resonator. However, this means that more space on the chip is required.

Another possibility consists in selecting appropriate substrate materials or changing the design accordingly. It is possible, for example, to change the layer structure as regards materials and layer thickness, in particular to apply and/or modify a trimming layer. An SiO2 layer applied as a compensation layer for the reduction of the TCF can, for example, be supplemented locally by an additional layer or merely have its thickness changed in order to reduce the coupling to the desired extent, whereby the pole zero distance is reduced.

A filter according to the invention is more power-resistant than a filter with a disturbing SH mode in the range of the passband or of the passband edge. The invention has no significant influence on the passband characteristic and for this reason provides only an improved performance.

A filter according to the invention can be used in duplexers and bandpass filters. It is preferably used as a TX filter, to which is applied in transmission mode a higher power than to an RX filter in receiving mode and in which an interfering mode therefore has a far more negative effect than in an RX filter.

As stated, the invention can be used with bandpass filters which use Rayleigh waves, are constructed on lithium niobate and have a compensation layer that reduces the coupling (TCF compensation). Advantageously, they are also used in resonators having copper-based electrodes. Such an electrode structure may comprise, for example, partial layers of chromium, silver, copper and chromium. An alternative electrode structure comprises, for example, layers of titanium, silver, copper and titanium.

According to one embodiment, the filter is constructed on lithium niobate substrate with a cutting angle between red-125 and red-130. This cutting angle range has a high coupling constant for Rayleigh waves.

As a preferred piezoelectric substrate for the filter, lithium niobate crystals having a red-128 cutting angle can be selected.

According to a further embodiment, the SAW filter according to the invention has an SiO2 layer as TCF compensation layer above the electrode metallization on the substrate. This layer can have a relative layer thickness in the range of 15 to 50% relative to the wavelength of the useful acoustic wave.

A silicon nitride layer can be applied over the compensation layer to shield against moisture.

According to a further advantageous embodiment, the first capacitor is formed with an interdigital structure, which can act as a resonator. The anti-resonance frequency can now be set to an interfering frequency to be suppressed outside the passband of the filter. Since primarily only the static capacitance of the resonator is used, the resonance frequency of this resonator can be set to an almost arbitrary frequency, as long as it is far enough away from the passband of the filter. Only then will the resonator act as a pure capacitor at frequencies in the passband of the filter. Due to the resonance frequency of the first parallel-connected capacitor, a pole is generated, which can be used particularly well to damp interfering frequencies when the pole is adjacent to the passband. However, even more distant interfering frequencies, such as, for example, higher-frequency resonances of plate modes or bulk waves, can be well suppressed by appropriately set resonance frequencies of the first capacitor.

In one embodiment, the SAW filter is designed for operation in a broadband frequency band with a relative bandwidth >3%, in particular for operation in bands 2 or 3.

A filter according to the invention may also have a plurality of first series resonators whose resonance frequencies without inventive measures cause an SH interference mode in the range of the passband or in the range of the passband edge.

Accordingly, in such SAW filters according to the invention, first capacitors are in each case connected in parallel to all first series resonators with a correspondingly low anti-resonance frequency. At the same time, these first series resonators are provided with a shorter finger period than is the case with the other series resonators. To ensure the necessary bandwidth of the filter, it is important here that other series resonators which have an unchanged pole zero distance remain in all cases.

A method also according to the invention can be used for shifting a disturbing SH mode, which occurs in filters on a lithium niobate substrate, which method uses Rayleigh waves as useful wave. In a first step, the filter is designed in a conventional manner on the basis of SAW one-port resonators. The achievement of a desired passband characteristic is the only thing taken into consideration for the draft design.

Such a filter is constructed in a known manner from a series branch, which is connected between the filter input and output and in which series resonators are arranged, and from n parallel branches, which are connected to a fixed potential and in parallel to the series branch and in each of which a parallel resonator is arranged. In this respect, a conventional ladder-type structure is designed.

In the next step, the one or more first series resonators which in this first draft have a disturbing SH mode in the range of the passband or passband edge are identified. This can be carried out by a simulation method that takes into account the occurrence of SH modes.

The first series resonators are then the series resonators thus identified as having the disturbing SH mode with respect to their frequency position. In each case, a first capacitor formed as an interdigital structure is now connected in parallel to these first series resonators, said capacitor reducing the pole zero distance of the first series resonator(s).

In the next design step, the anti-resonance frequency shifted due to the smaller pole zero distance is shifted back to its intended position in the range of the right-hand passband edge by correspondingly reducing the finger period of these first series resonators. The amount of the frequency shift of the resonance frequency caused by the reduced finger period preferably corresponds exactly to the amount by which the pole zero distance is shortened. In this way, the anti-resonance frequency of the first series resonators returns to the frequency which the first series resonators would have without parallel capacitor and without finger period reduction, which corresponds to the optimum frequency position determined in the first step.

In the next step, the capacitance of the resonator is reduced by reducing the aperture or by reducing the number of fingers, so that the total capacitance of resonator and parallel capacitor corresponds again to the original capacitance of the resonator.

In the method according to the invention, the said frequencies of the first series resonators are shifted so far that the frequency of the SH mode dependent on the resonance frequency of these resonators is shifted to a frequency above the passband edge.

According to one embodiment of the invention, a frequency value $\Delta f$ is first determined by which the SH mode is at least to be shifted upward until it no longer disturbs the passband. By exactly this value $\Delta f$, the pole zero distance is then reduced, which is set by selecting an appropriate capacitance value of the first parallel capacitor.

In a specific embodiment, the filter is designed for TX frequencies in cellular radio band 2, which by definition are at 1850 MHz to 1910 MHz. The RX frequencies of cellular radio band 4 are also arranged above the passband in the range from 2110 MHz to 2155 MHz. According to this embodiment, the capacitor parallel to the first series resonator is now designed as a resonator and its frequency position is set so that in the transfer function of the filter, a pole is formed in the RX frequencies of band 4. Disturbance of the RX band of the adjacent band 4 is thereby avoided.

The invention is explained in more detail below with reference to embodiments and the associated figures. The figures are purely schematic and, in some cases, take the form of block diagrams. In the figures, only the important elements of the invention are shown, to which reference is made as well. This means that even more elements, not shown, can be present in a filter according to the invention.

BRIEF DESCRIPTION OF THE DRAWINGS

Shown are.

DETAILED DESCRIPTION OF THE INVENTION

Figure 1:
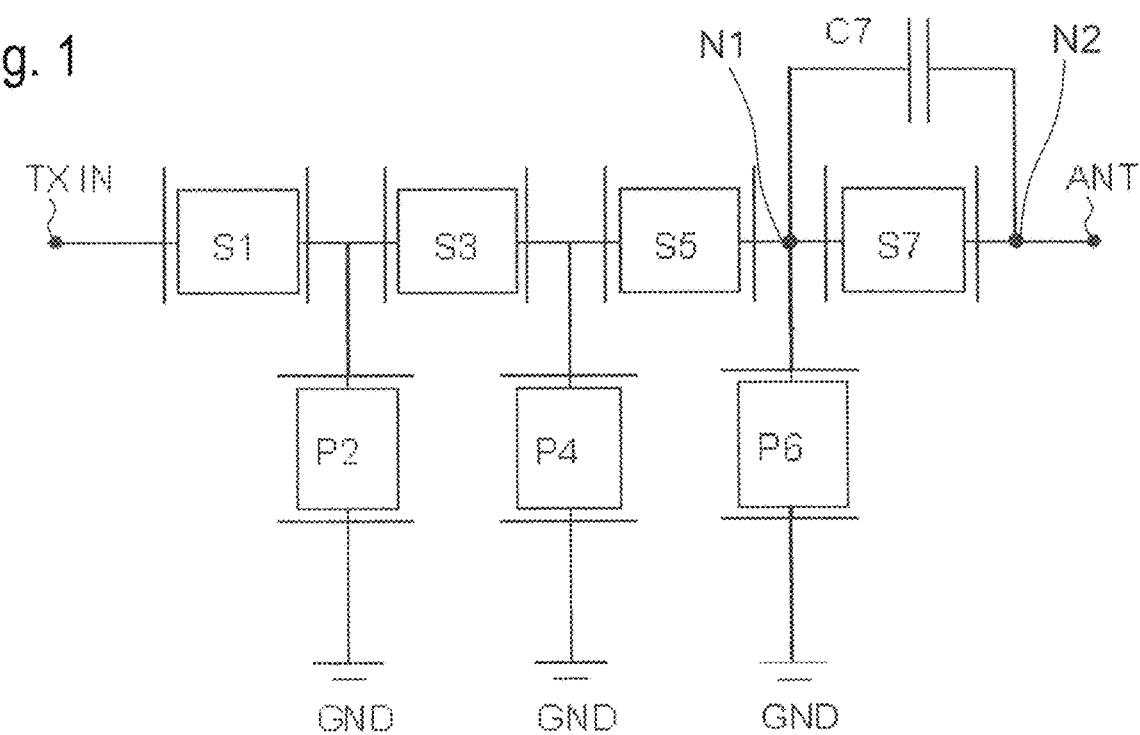
FIG. 1 a first SAW filter according to the invention.

In a schematic block diagram, FIG. 1 shows a first exemplary embodiment according to the invention. The filter consists of a series branch, which is connected between two terminals TXIN and ANT. Four series resonators S1, S3, S5 and S7 are arranged in the series branch. Between two series resonators each, a parallel branch which is connected to ground GND and in which a parallel resonator P2, P4 or P6 is respectively arranged branches off from the series branch. A capacitor C7 is connected in parallel to one of the series resonators, in this case to the series resonator S7. This capacitor connects a first circuit node N1 in the series branch before the series resonator S7 to a second circuit node N2, which is arranged in the series branch after the series resonator S7. All series and parallel resonators S, P are listed as SAW resonators.

Figure 2:
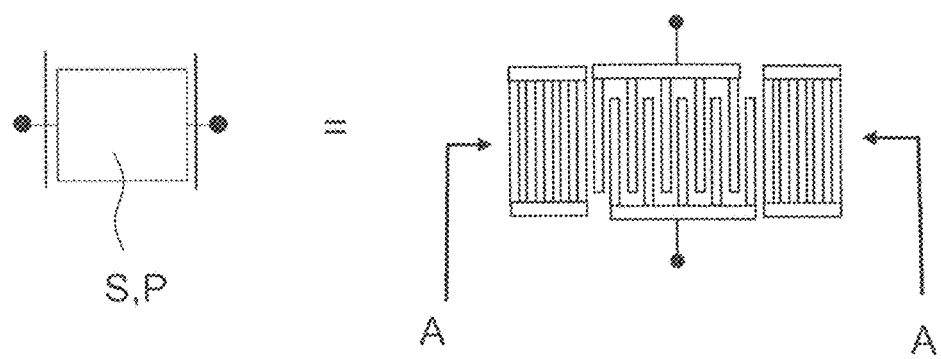
FIG. 2 the circuit symbol and metallization of a resonator which can also be used as a capacitor, FIG. 3 detail of an inventive filter in schematic cross-section, FIG. 4 a further exemplary embodiment of a filter according to the invention in which parallel-connected capacitors are designed as resonators with resonance frequencies outside the passband, FIG. 5 the impedance of a first resonator before and after variation according to the invention, FIG. 6 the impedances of the resonators used for a filter according to the invention, together with the resulting transmission curve, FIG. 7 the transmission curves determined by simulation for the filter shown in FIG. 6, FIG. 8 a filter known from the prior art, FIG. 9 the impedances of the resonators used for filters of FIG. 8, together with the resulting transmission curve, FIG. 10 the simulated passband of the filter according to FIGS. 8 and 9 with and without consideration of SH modes.

On the left-hand side, FIG. 2 shows the circuit symbol used for the resonators, while the right-hand side shows in schematic form an example of the metallization of a resonator that can be used for the invention. Preferably copper-based multilayer systems are used as metallizations, for example, a layer sequence of chromium Cr, silver Ag, copper Cu and chromium Cr or a layer sequence of titanium Ti, silver Ag, copper Cu and titanium Ti. However, other layer systems for the electrodes are possible but preferably have at least one copper layer.

The metallization is deposited on a piezoelectric substrate with high coupling, in particular on a lithium niobate crystal with a crystal cut red-128.

Figure 3:
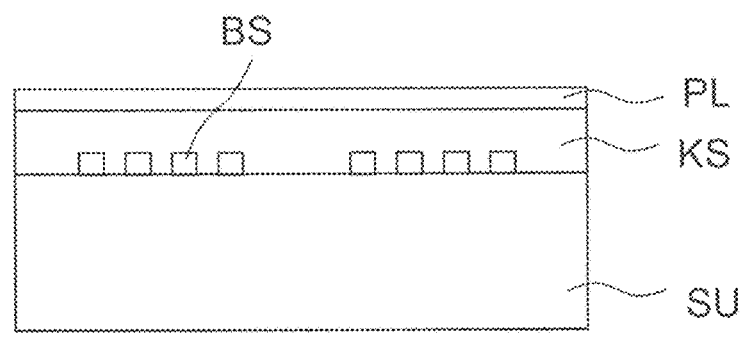

FIG. 3 shows a cross-section through a SAW filter according to the invention. The component structures of the filter on the piezoelectric substrate SU are shown, in particular the electrode fingers and/or the fingers of the associated reflectors in the cross-sectional view transverse to the finger extension. Directly on top of the substrate SU coated with the component structures BS, a compensation layer KS is applied, by means of which the temperature coefficient of the frequency is reduced or even compensated. For this purpose, an SiO2 layer of sufficient layer thickness is normally used.

In order to protect the moisture-sensitive compensation layer KS against environmental influences, a protective layer PL is also applied as a final uppermost layer, for example, a thin silicon nitride layer having a thickness of 10 nm to 200 nm.

Figure 4:
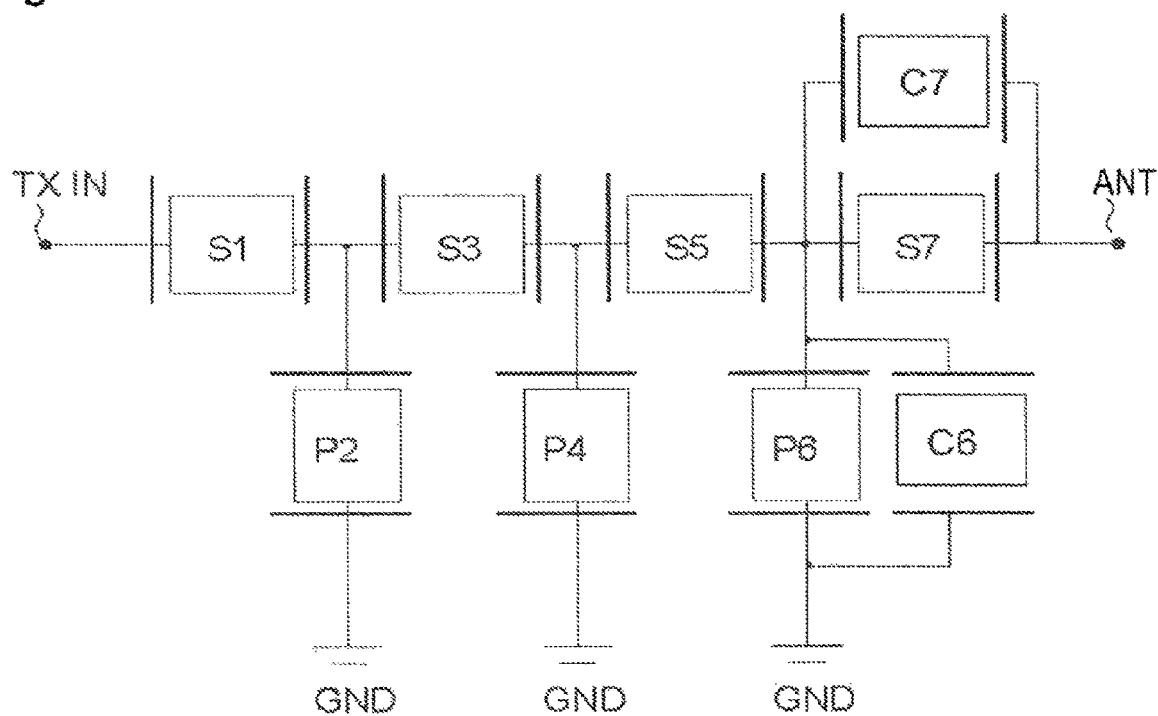

FIG. 4 shows another exemplary embodiment of a filter according to the invention. This shows as a further design element a capacitor C6, which is connected in parallel to a parallel resonator P6. With the help of this capacitor, the bandwidth of the resonator or its pole zero distance is successfully reduced. In particular, this results in a steeper impedance curve, with which it is possible in the filter structure according to FIG. 4 to increase the slope of the passband edge.

In FIG. 4, the capacitors C6 and C7 are also designed and shown as resonators but with a finger period changed with respect to all other resonators in order to prevent any resonances from occurring in the passband and for the resonator in question to function there as a pure capacitor.

For a further explanation of the invention, in particular for an explanation of the method according to the invention for shifting a disturbing SH mode, the method for designing a filter according to the invention will be described in part below and the necessary measures will be explained.

Figure 8:
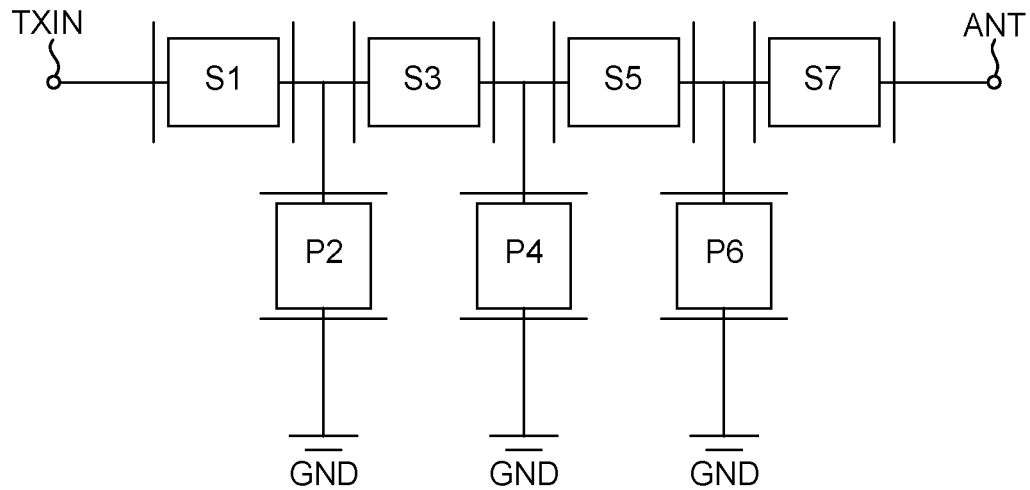

FIG. 8 shows a conventional SAW filter with the same basic structure as the SAW filter according to the invention shown in FIG. 1, in which only the capacitor connected in parallel to a series resonator is missing. The frequencies of the series and parallel resonators S, P are selected such that a desired passband results. In this respect, the filter is optimized for the desired band.

Figure 9:
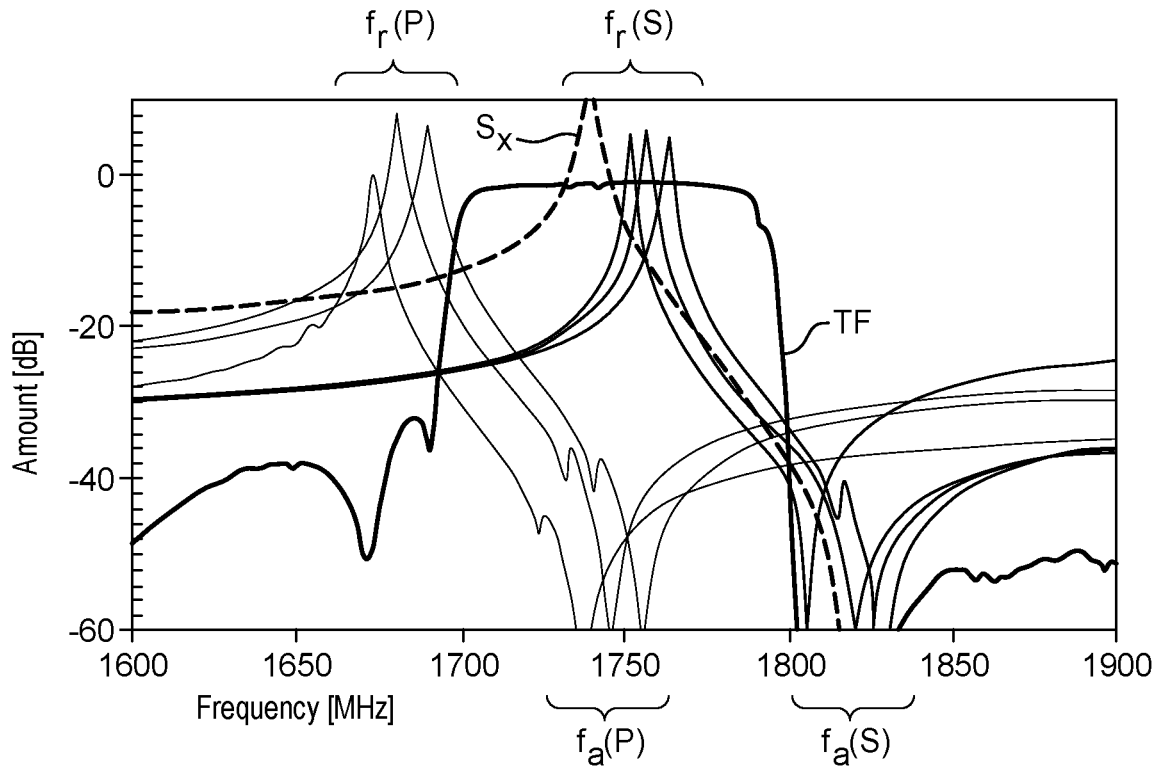

FIG. 9 shows the various resonators used for the known filter according to FIG. 8 with their impedances and the resulting transmission curve TF or transfer function.

In order to realize the filter with the high bandwidth shown, the resonance frequencies fr(P) and fr(S) of the series resonators S and the parallel resonators P are offset from each other and preferably all selected differently. In the range fr(P), the resonance frequencies of the parallel resonators occur, recognizable at the minimum of their impedance curves. With a constant pole zero distance, the anti-resonances of the parallel resonators can be found at the corresponding distance in the fa(P) range.

In a same or similar frequency range fr(S), the resonance frequencies of the series resonators are found, which are preferably arranged symmetrically to the center of the passband.

The anti-resonance frequencies of the series resonators are found in the frequency range fa(S) above the right passband edge of the transfer function TF.

All curves shown in FIG. 9 are the result of a simulation that was determined without taking into account interfering shear wave modes (SH modes) that occur.

Figure 10:
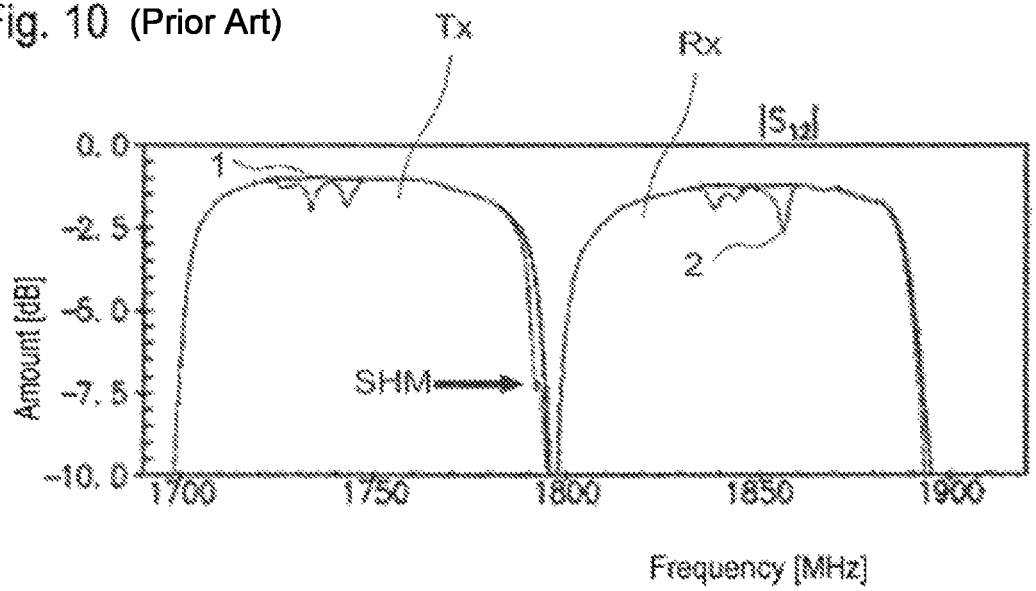

If, however, the occurrence of SH modes is permitted in the simulation calculation, the transmission behavior in the passband as shown in FIG. 10 is obtained for the filter structure shown in FIGS. 8 and 9. Two passbands for the TX filter (left curves) and the RX filter (right curves) of a duplexer are shown. For better recognition of the effect of a disturbing SH mode SHM, two curves are superimposed in the diagram, corresponding to the simulation without consideration of the SH modes according to curve 1 and once taking into account SH modes occurring according to curve 2. In the TX filter, an interfering resonance appears at the point marked with an arrow in the right passband edge, corresponding to the disturbing SH mode SHM. However, such an SH mode in the range of the passband edge leads to a greater thermal load on the filter, which leads to an additional power load on the filter and correspondingly to a higher thermal load, which accelerates filter aging and can damage the component structures BS.

The calculation also shows that the disturbing SH mode is generated by the series resonator with the lowest resonance frequency. The distance between SH mode and resonance frequency will thus only fall within the range of the passband edge when the resonance frequency of the useful mode (Rayleigh wave) is disposed at a correspondingly low frequency, since the frequency distance between the SH mode and the Rayleigh mode is virtually constant in the resonators of the filter. The impedance of this first resonator is designated by Sx in FIG. 9.

The disturbing SH mode can be minimized by suitable adjustment of the layer thicknesses of electrodes, compensation layer and protective layer, and by a suitable choice of the metallization ratio of the electrodes. However, since the exact tuning has a tolerance due to production-related deviations, it cannot be effectively suppressed in a series production, or the proportion of filters with no or poorly suppressed SH mode is too high.

A simple shift of the resonance frequency of the series resonator with the disturbing SH mode toward higher frequencies and thus also a shift of the interfering peak of the SH mode out of the range of the passband edge is not possible without adversely affecting the passband characteristic or the right-hand passband edge. According to the invention, the pole zero distance of this resonator with the disturbing SH mode is therefore reduced by a frequency amount □f by connecting a capacitor in parallel to this series resonator, see, for example, the capacitors C7 in FIGS. 1 and 4. Due to this capacitor, the anti-resonance frequency of the series resonator is shifted by the amount Δf toward lower frequencies and the pole zero distance is thus reduced. However, in order to compensate for this effect and bring the anti-resonance frequency important for the formation of the passband edge back to the right place, the finger period is shortened in parallel thereto in order to move the resonance frequency by the amount Δf toward higher frequencies.

Figure 5:
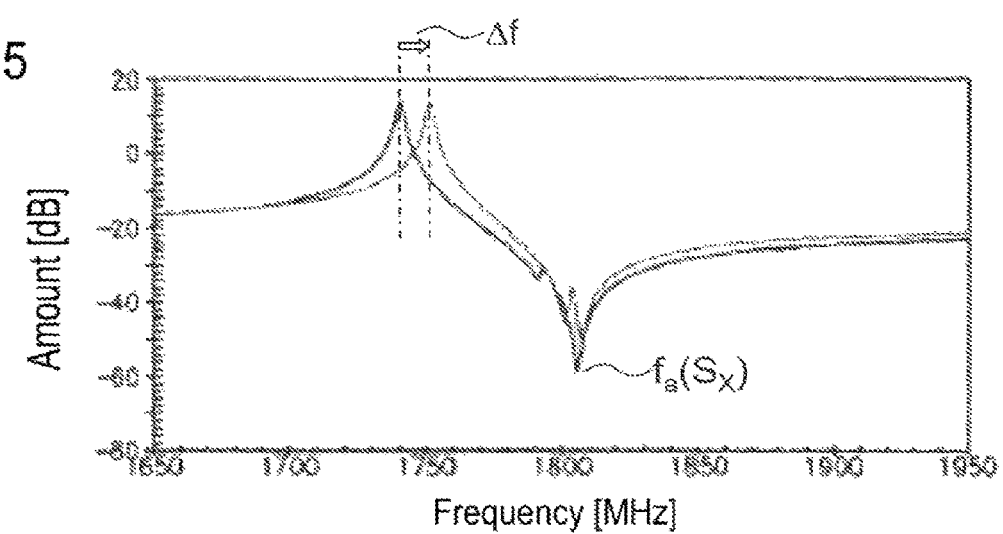
Figure 6:
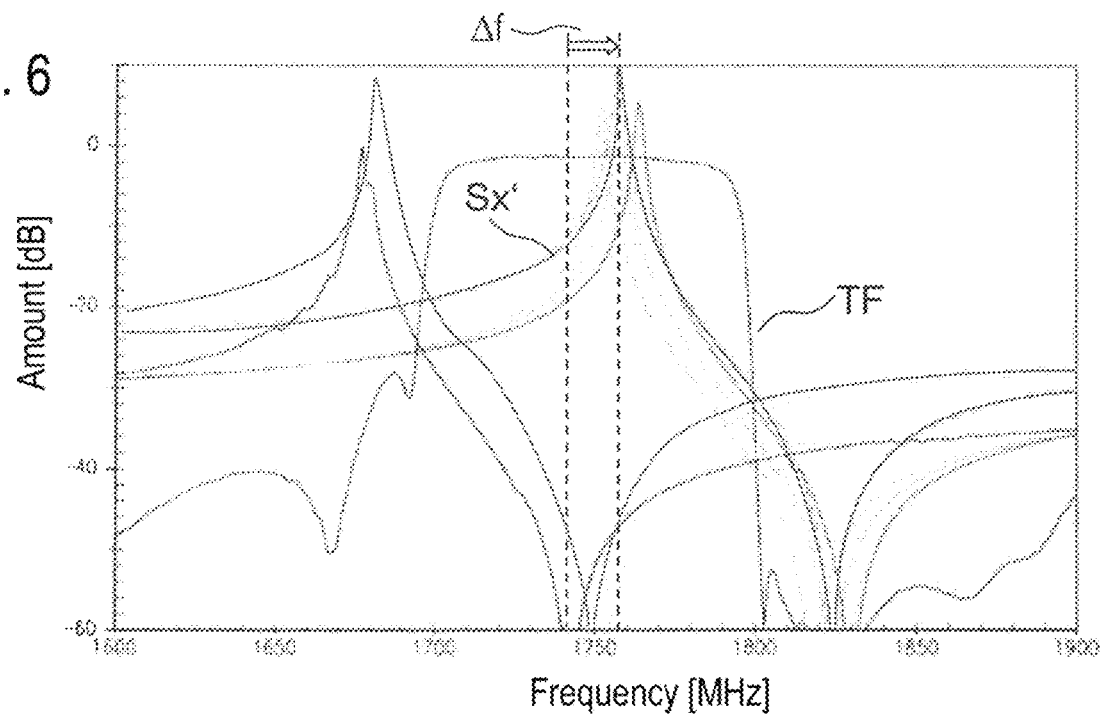

FIG. 5 shows a simulation calculation of the impedance of the first series resonator without a capacitor (left-hand curve) and with a parallel-connected capacitor and an extended finger period (right-hand curve). These two measures result in the position of the anti-resonance frequency corresponding to the minimum of the two curves remaining practically unchanged, while the resonance frequency shifts by the amount Δf toward higher frequencies. FIG. 6 shows a representation corresponding to FIG. 9 but in which the impedance of the series resonator with the parallel-connected capacitor is now changed in its position and its pole zero distance. The resonance frequency is now shifted upward by an amount Δf, while the position of the anti-resonance remains unchanged. It can be seen that, with this parallel capacitor, the passband TF remains almost unchanged.

Figure 7:
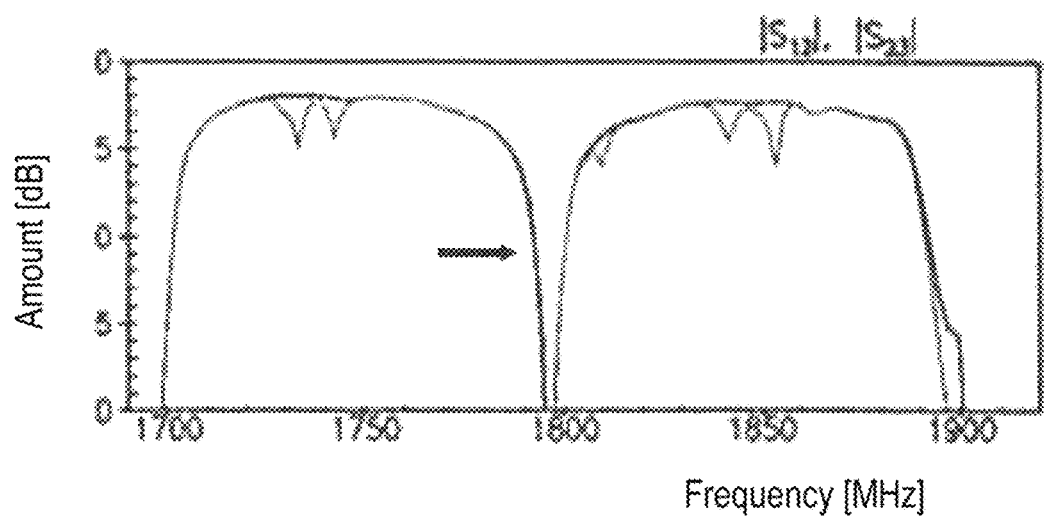

FIG. 7 shows the passband of the corresponding filter in a simulation with and without consideration of SH modes. The two curves are again shown above one another, corresponding to FIG. 10 already described. In comparison with FIG. 10, the effect produced by the invention now appears in FIG. 7, namely that in the range of the right-hand passband edge (see arrow), the SH mode (see SHM in FIG. 10) completely disappears or no longer occurs in both calculations or in both curves. The remaining passband characteristics remain virtually unchanged, so that, with the measure according to the invention, no disadvantages have to be accepted in the range of the passband.

In further embodiments, not shown, more of the resonators beyond those shown in FIG. 4 can be connected in parallel to capacitors. To avoid reducing the bandwidth of the filter, only those series resonators of low frequency whose SH mode falls within the passband or its edge are connected in parallel to capacitors. Furthermore, the number of parallel branches and the number of series resonators can be further increased.

In another embodiment, not shown, individual, several or all of the resonators are cascaded. Cascading here means that the individual SAW resonator as shown in FIG. 2 is replaced by a series connection of at least two partial resonators. Cascading lowers the voltage applied to the resonator, so that the area of the resonator is to be increased accordingly to compensate for this. At the same time, the power stability of the component structures is thereby increased, so that in particular those resonators are cascaded which are exposed to the strongest signal amplitudes. These are, in particular in the case of a TX filter, the series resonators arranged close to the input (TXin) and also the parallel resonators with the highest resonance frequency. Also not shown are inductors, with which in particular the parallel branches can be connected in series to a fixed potential.

Also not shown is an embodiment in which the parallel capacitor C7 according to the invention or another capacitor also connected in parallel to a series resonator is designed as a SAW resonator according to FIG. 2, whose finger period or resonance frequency is set to a value outside the passband so that the resonator can act purely capacitively within the working range of the filter.

If the resonance frequency of this resonator acting as a capacitor is now set to a value which corresponds to a frequency to be suppressed of another system or standard, this SAW resonator can be used to damp this interference signal. Since its resonance frequency can be shifted within a wide range, a pole can therefore be generated with this resonator at any desired location and the interfering frequency located there can be correspondingly suppressed.

Figure 11:
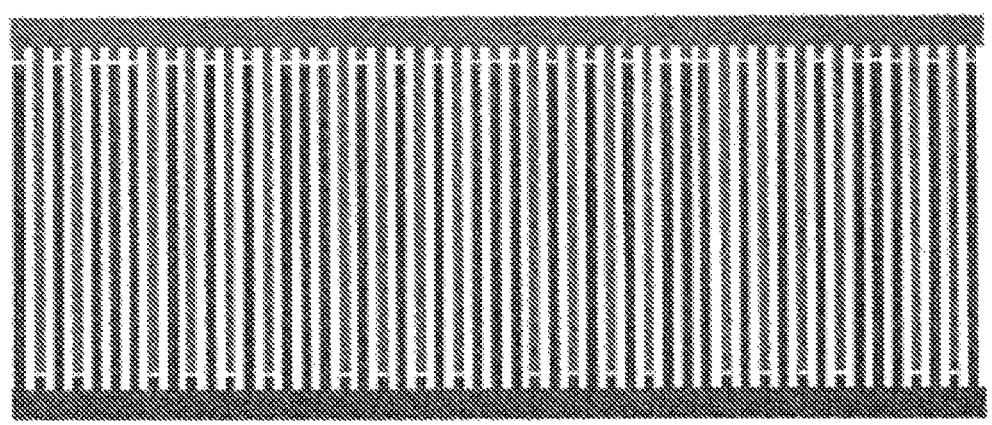
FIG. 11 is a plan view of an alternatively usable series resonator with omission weighting, FIG. 12 the relative space requirements of alternative solutions for reducing the pole zero distance.

FIG. 11 shows a plan view of a resonator with omission weighting. This represents a further alternative to using parallel capacitors to reduce the pole zero distance of a resonator.

Figure 12:
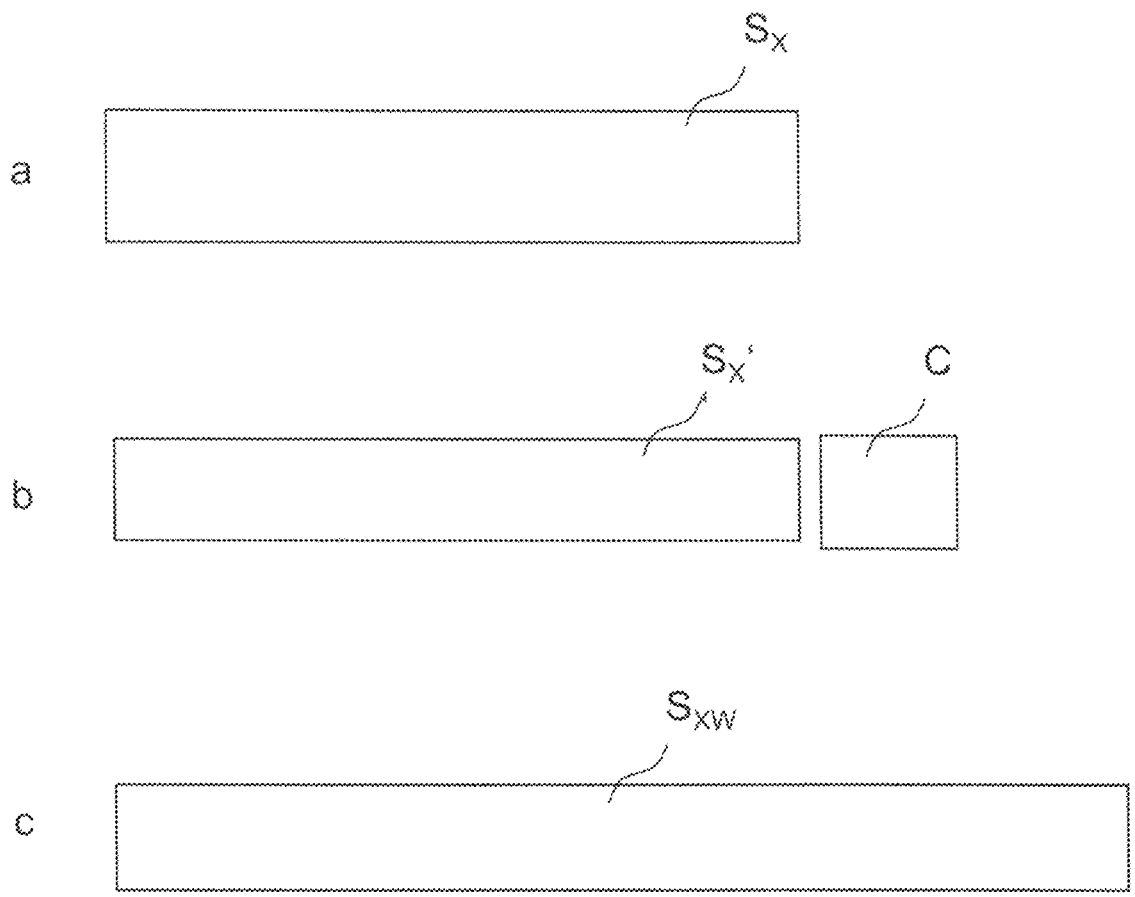

In true-to-scale sub-figures a, b and c, and thus in a suitable manner for comparing sizes, FIG. 12 shows the respective footprint and thus the space requirement (a) of an unchanged series resonator SX
(b) of a series resonator SX' with a scaled finger period, reduced aperture, and parallel capacitor C (c) of an equivalent series resonator SXW with omission weighting From the figure, it is clear that the space requirement increases from a) to c), but the solution b) is the one that requires the least additional space.

The invention has been described only with reference to a few embodiments and is therefore not limited to these. A filter according to the invention can therefore deviate from the illustrated structures, that is to say, the block diagram shown. Furthermore, the filter can also differ in its layer structure of the known layer structure shown in FIG. 3. In addition, the capacitors can be fabricated using any technology, provided a design as a SAW resonator for generating an additional pole is not desired. The filter according to the invention may be part of a duplexer, the invention being used not only as a reception filter but also, in particular, as a TX filter of the duplexer.

The invention claimed is:

1. A SAW filter comprising:
    a series branch, which is connected between a filter input and a filter output and in which series resonators (RS) are arranged, and
    n parallel branches connected in parallel to the series branch and connected to a fixed potential, in each of which a parallel resonator is arranged, wherein 2 ≤n ≤5,
    in which a first series resonator ($S_x$) of the series resonators is formed with a lowest anti-resonance frequency of all the series resonators,
    in which a pole zero distance of the first series resonator compared to the other series resonators is reduced to a point that a parasitic shear mode of an acoustic wave is shifted out of a passband of the filter,
    in which the other series resonators have a higher pole zero distance and a lower finger period than the first series resonator.

2. The SAW filter according to claim 1,
    in which the pole zero distance of the first series resonator is reduced by a first capacitor being connected in parallel to the first series resonator
    in which a value of the capacitor is dimensioned such that due to a larger finger period and a smaller pole zero distance of the first series resonator, the parasitic shear mode of the acoustic wave is shifted out of the passband of the filter.

3. The SAW filter according to claim 1 or 2, wherein the filter is constructed on a lithium niobate substrate with a cutting angle between red 125 and red 130.

4. The SAW filter according to claim 1 wherein the filter comprises an $SiO_2$ layer for compensating a temperature response of the filter being disposed on a substrate via an electrode metallization.

5. The SAW filter according to claim 1, in which a pole zero distance of the series resonators in which a disturbing shear horizontal (SH) mode occurs is reduced in order to achieve a correction of the position of the SH mode, by at least one of
    changing a layer structure with respect to materials and layer thickness, in particular by applying and/or modifying a trimming layer
    omission weighting,
    connecting to a parallel capacitor designed as a resonator.

6. The SAW filter according to claim 1, wherein the filter is configured to operate in a band with a relative bandwidth greater than 3% in band 2 or 3.

7. The SAW filter according to claim 1,
    in which all of the series resonators whose shear horizontal (SH) mode lies in a range between a right-hand passband edge and a foot of a flank have a reduced pole zero distance.

8. The SAW filter according to claim 2, wherein the first capacitor is designed as a resonator.

9. The SAW filter of claim 2, wherein the first capacitor is configured as an interdigital structure.

10. A method for shifting a disturbing shear horizontal (SH) mode in a SAW filter constructed on a lithium niobate substrate and using Raleigh waves,
    a) in which in a first step the filter is designed using SAW resonators,
    b) wherein a series branch, which is connected between a filter input and a filter output and in which series resonators (RS) are arranged, and n parallel branches, which are connected in parallel to the series branch and connected to a fixed potential and in each of which a parallel resonator is arranged, are provided,
    c) in which a first series resonator(s) of the series resonators which have disturbing SH modes in a range of a passband or a passband edge are identified,
    d) in which a first capacitor configured as an interdigital structure is in each case provided and connected in parallel to the first series resonator(s) so that a pole zero distance of the first series resonators(s) is reduced in comparison with the other series resonators,
    e) in which a finger period of the first series resonator(s) is adjusted until an anti-resonance is in the range of a right-hand passband edge of the filter,
    f) in which a value of the first capacitor reducing the pole zero distance is at least dimensioned high enough that, according to method step e), a frequency of the SH mode dependent on a resonance frequency of the first series resonator(s) is shifted toward a frequency above the passband edge.

11. A filter circuit, comprising:
    a series branch connected between a filter input and a filter output, the series branch comprising a plurality of resonators each electrically connected in series;
    n parallel branches each electrically connected in parallel to the series branch, each of the n parallel branches comprising a parallel resonator,
    wherein a first resonator of the plurality of resonators in the series branch has a larger finger period as compared to finger periods of each other resonator of the plurality of resonators; and
    a capacitor electrically connected in parallel to the first resonator, the capacitor having a capacitance value that reduces a pole zero distance of the first series resonator to a point that a shear mode of an acoustic wave is shifted out of a passband of the filter circuit.

12. The filter circuit of claim 11, wherein the capacitor is configured as an interdigital structure.

13. The filter circuit of claim 11, wherein the first resonator has a lower anti-resonant frequency as compared to each other resonator of the plurality of resonators.

14. The filter circuit of claim 11, wherein the filter circuit comprises an $SiO_2$ layer.

15. The filter circuit of claim 11, further comprising a second capacitor electrically connected in parallel to the parallel resonator of one of the n parallel branches.

* * * * *